United States Patent
Gunda et al.

(10) Patent No.: US 7,293,210 B2
(45) Date of Patent: Nov. 6, 2007

(54) SYSTEM AND METHOD FOR IMPROVING TRANSITION DELAY FAULT COVERAGE IN DELAY FAULT TESTS THROUGH USE OF TRANSITION LAUNCH FLIP-FLOP

(75) Inventors: Arun Gunda, San Jose, CA (US); Narendra Devta-Prasanna, Bangalore (IN)

(73) Assignee: LSI Corporation, Milpitas, CA (US)

( * ) Notice: Subject to any disclaimer, the term of this patent is extended or adjusted under 35 U.S.C. 154(b) by 148 days.

(21) Appl. No.: 11/124,438

(22) Filed: May 6, 2005

(65) Prior Publication Data
US 2006/0253754 A1 Nov. 9, 2006

(51) Int. Cl.
*G01R 31/28* (2006.01)
(52) U.S. Cl. ............... 714/726; 714/738; 326/16
(58) Field of Classification Search ........ 714/724, 714/726, 738, 727, 729; 324/73; 326/16
See application file for complete search history.

(56) References Cited

U.S. PATENT DOCUMENTS 6,108,805 A * 8/2000 Rajsuman ............... 714/724
6,148,425 A * 11/2000 Bhawmik et al. ........ 714/726
6,611,932 B2 * 8/2003 How et al. .............. 714/724
7,039,845 B2 * 5/2006 Rearick et al. .......... 714/738
7,131,081 B2 * 10/2006 Wang et al. ................ 716/4

* cited by examiner

*Primary Examiner*—Guy Lamarre
*Assistant Examiner*—Esaw T. Abraham
(74) *Attorney, Agent, or Firm*—Suiter West Swantz PC LLO

(57) ABSTRACT

The present invention is directed to a system and method for improving transition delay fault coverage through use of augmented flip-flops (TL flops) for a broadside test approach. The TL flops use the same clock for scan and functional operation. Thus, the TL flops do not require a fast signal switching between launch and test response capture. Each of the TL flops includes additional multiplexer in front of a standard scan flop and a transition enable (TEN) signal. Moreover, only a heuristically selected subset of scan flip-flops is replaced with the TL flops and only one additional MUX per selected scan flip-flop may contribute an area overhead. Consequently, the overall chip area overhead may be minimal. The present invention may be suitable for being implemented with currently available third party ATPG.

22 Claims, 5 Drawing Sheets

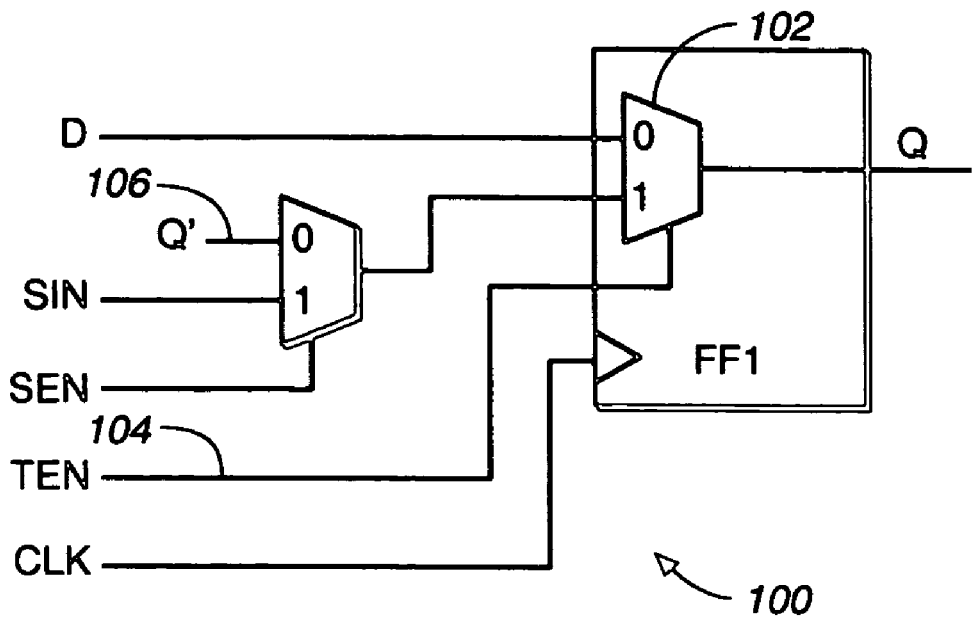
FIG._1
| SEN | TEN | Operation of Flip-Flop |
|---|---|---|
| 0 | 0 | Functional Mode / Standard Broadside Test Mode |
| 0 | 1 | Enhanced Broadside Test Mode |
| 1 | 1 | Scan Shift Mode |
| 1 | 0 | Not Allowed |
FIG._2

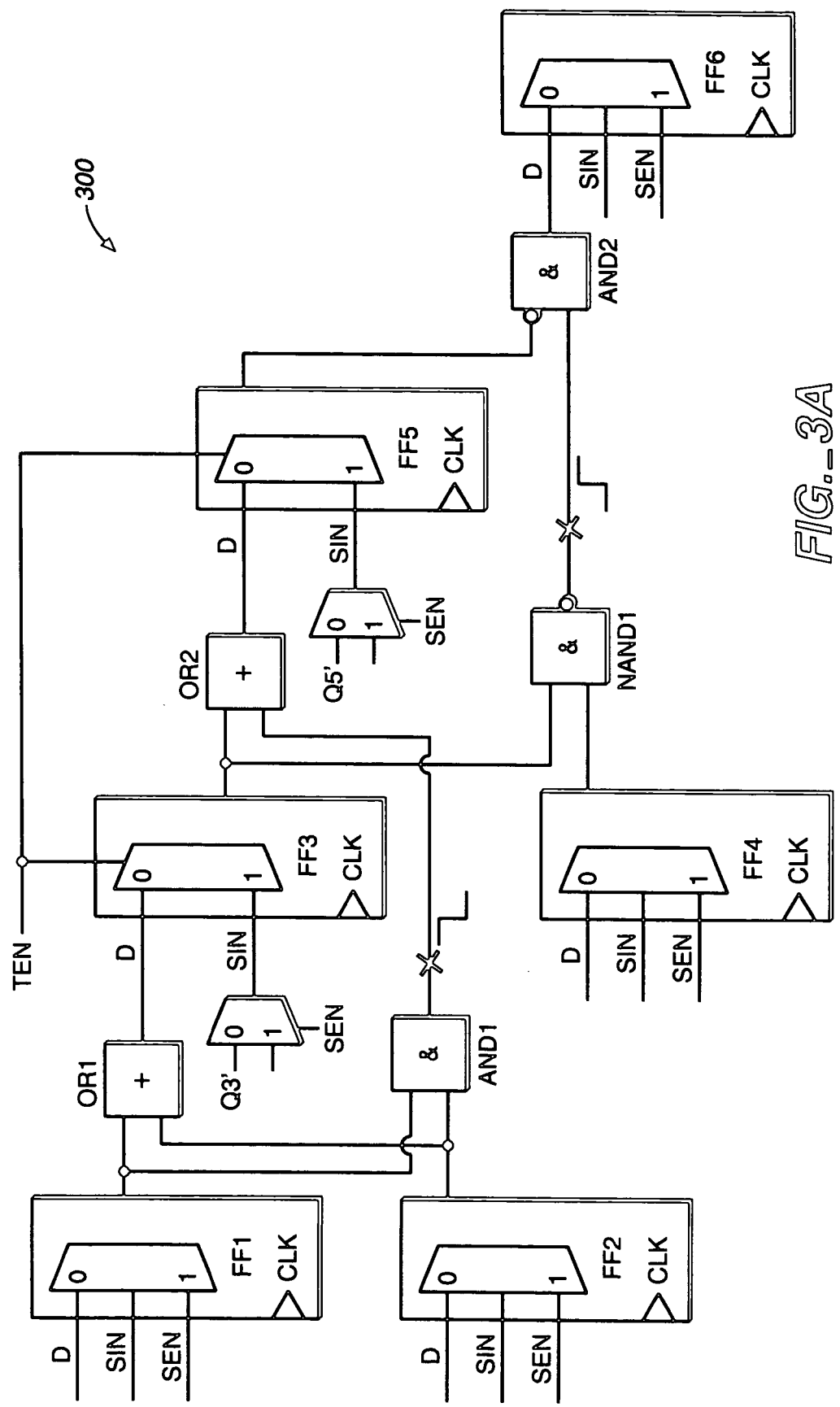
FIG._3A

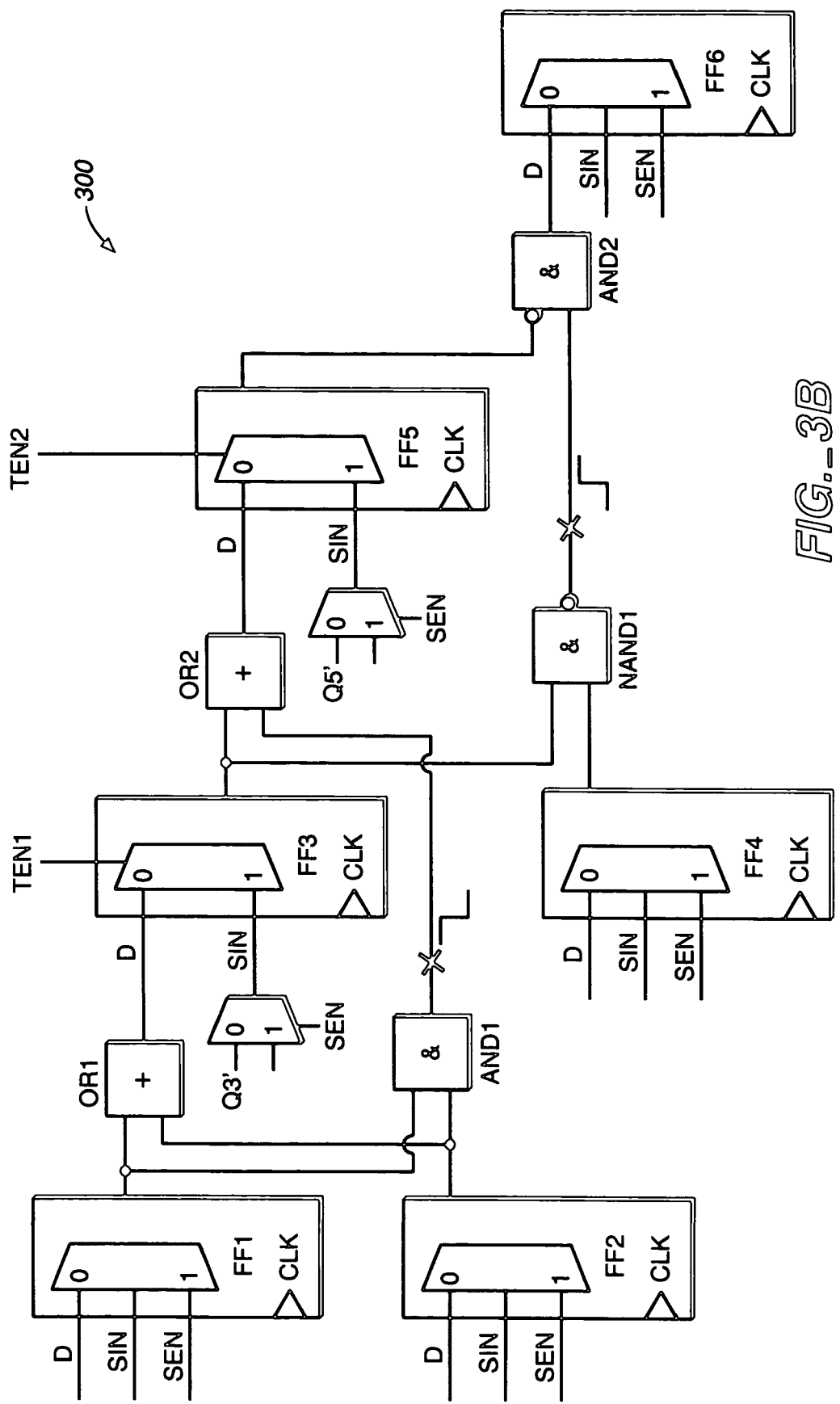
FIG._3B

FIG._4A

| FF | Affected Faults |
|---|---|
| $s_1$ | $f_1, f_4, f_5, f_6$ |
| $s_2$ | $f_3, f_6$ |
| $s_3$ | $f_1, f_2, f_5, f_7, f_8, f_9$ |
| $s_4$ | $f_1, f_4, f_8$ |
| $s_5$ | $f_2, f_{10}$ |
| $s_6$ | $f_3, f_5, f_6, f_{11}$ |
| $s_7$ | $f_{10}$ |

| FF | Affected Faults | Rank(s) |
|---|---|---|
| $s_1$ | $f_1, f_4, f_5, f_6$ | 4 |
| $s_2$ | $f_3, f_6$ | 2 |
| $s_3$ | $f_1, f_2, f_5, f_7, f_8, f_9$ | 6 |
| $s_5$ | $f_2, f_{10}$ | 2 |
| $s_6$ | $f_3, f_5, f_6, f_{11}$ | 4 |

| FF | Affected Faults | Rank(s) |
|---|---|---|
| $s_1$ | $f_4, f_6$ | 2 |
| $s_2$ | $f_3, f_6$ | 2 |
| $s_5$ | $f_{10}$ | 1 |
| $s_6$ | $f_3, f_6, f_{11}$ | 3 |

| FF | Affected Faults | Rank(s) |
|---|---|---|
| $s_1$ | $f_4$ | 1 |
| $s_5$ | $f_{10}$ | 1 |

400

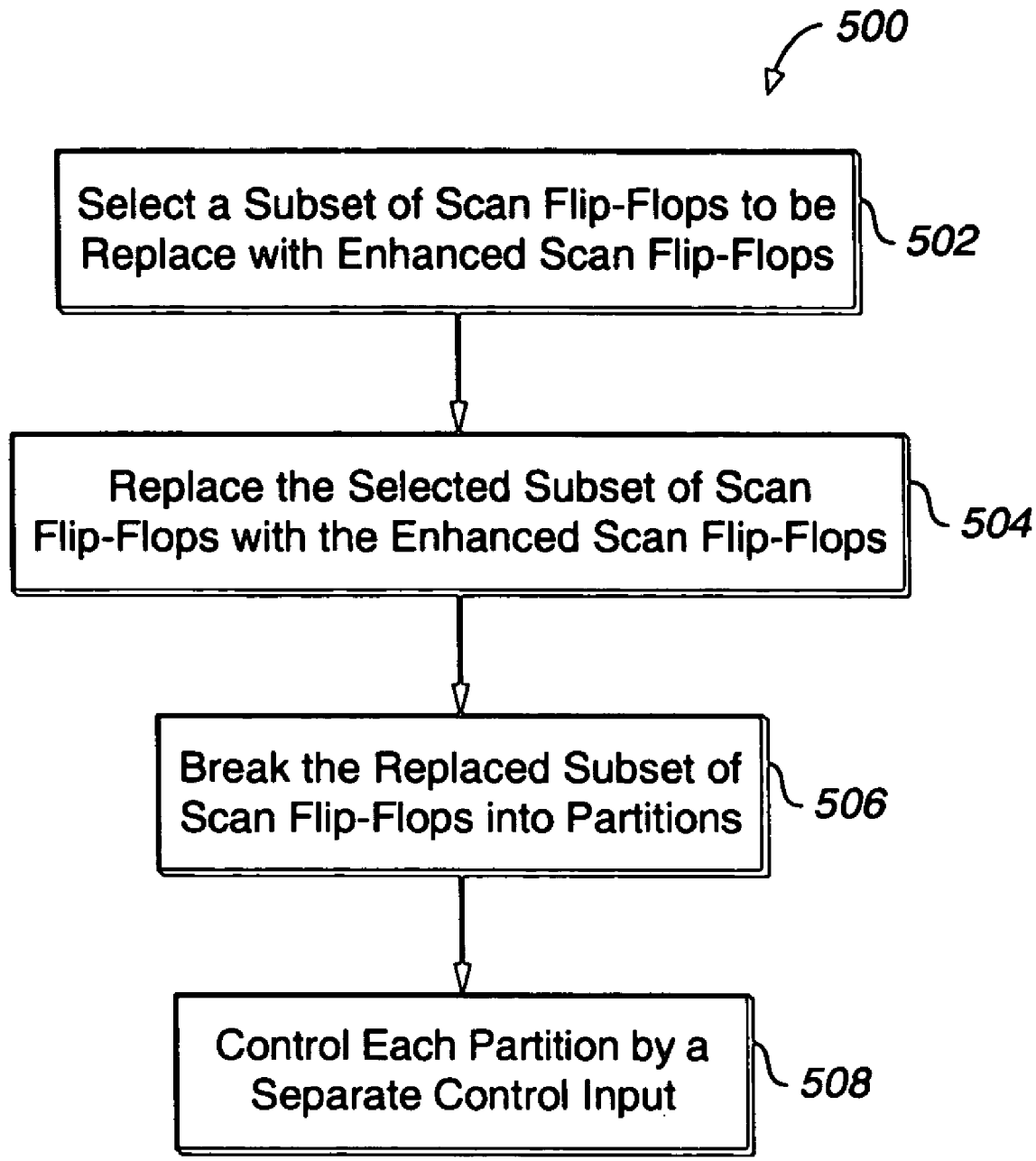
FIG._5

SYSTEM AND METHOD FOR IMPROVING TRANSITION DELAY FAULT COVERAGE IN DELAY FAULT TESTS THROUGH USE OF TRANSITION LAUNCH FLIP-FLOP

CROSS-REFERENCE TO RELATED APPLICATIONS

The present application herein incorporates U.S. Patent Application Mailing Label Number EV 663 351 866 US, filed on May 6, 2005, entitled "SYSTEM AND METHOD FOR IMPROVING TRANSITION DELAY FAULT COVERAGE IN DELAY FAULT TESTS THROUGH USE OF AN ENHANCED SCAN FLIP-FLOP," which is herein incorporated by reference in its entirety.

FIELD OF THE INVENTION

The present invention generally relates to the field of integrated circuits, and particularly to a system and method for improving transition delay fault coverage in delay fault test through use of a transition launch flop.

BACKGROUND OF THE INVENTION

As integrated circuits are produced with greater and greater levels of circuit density, efficient testing schemes that guarantee very high fault coverage while minimizing test costs and chip area overhead have become essential. Particularly, verifying at-speed performance of integrated circuits is important to ensure a satisfactory shipped part quality level (SPQL). In the past, at-speed performance of integrated circuits was typically verified using functional tests. However, as the complexity and density of circuits continue to increase, high fault coverage of several types of fault models becomes more difficult to achieve with traditional testing paradigms. For example, it is not feasible to develop functional tests for today's multi-million gate designs to achieve satisfactory defect coverage due to the prohibitive cost of such development. Conventionally, the scan-based delay testing approach is used as a low-cost alternative to functional testing for verifying at-speed performance of integrated circuits.

Timing failures caused by delays may result in circuitry logic failure and eventually lead to a system failure. Thus, in the scan-based delay testing approach, performance failures are modeled as delay-causing faults and test patterns are generated by an automatic test pattern generator (ATPG).

Transition delay fault and path delay fault models are known to provide a good coverage of delay-causing faults. The transition delay fault model targets every node in the design for a slow-to-rise and a slow-to-fall delay fault whereas the path delay fault model targets the cumulative delay through paths in the circuit. Typically, the transition delay fault (TDF) test model requires two-pattern tests, involving a first pattern and a second pattern. The TDF model is commonly used in the industry since it is simple and existing ATPG algorithms can be easily adapted to generate tests for TDF faults. Conventionally, there are two accepted approaches of testing for TDF faults, such as skewed-load testing and broadside testing. Both of the two approaches may generate the first pattern called an initialization pattern in a similar fashion. However, the two approaches differ in how the second pattern called the launch pattern is obtained.

In the broadside testing, the launch pattern is derived from the circuit response to the initialization pattern. The broadside testing requires two cycles of sequential processing. The sequential processing of the broadside testing results in less than optimal fault coverage using commercially available ATPG tools and, thus, results in long run time and low coverage.

In the skewed-load testing, the launch pattern is obtained by a one-bit shift of the initialization pattern. The test response to the second pattern is captured by applying a system clock pulse. Generally, the skewed-load testing achieves higher fault coverage than the broadside testing. However, the skewed-load testing requires that scan enable (SEN) signal has to change fast and accommodate the system clock period. Presently, the design effort involved in designing a fast SEN signal and the resulting impact on turnaround time is considered unacceptable for many designs. Consequently, the broadside testing is often preferred over the skewed-load testing in scan designs that use the system clock for scan operations since broadside testing does not requires a fast (at-speed) scan enable signal. As such, some restrictions on scan designs may force testers to employ the broadside testing even though it does not provide optimal transition delay test (TDF) fault coverage.

Therefore, it would be desirable to provide a method and system which can overcome the drawback of the broadside testing and achieve greater TDF coverage with a minimal test costs and chip area overhead.

SUMMARY OF THE INVENTION

Accordingly, the present invention provides a system and method for providing enhanced broadside testing. Transition delay test coverage may be improved through use of augmented flip-flops for the broadside testing. The augmented flip-flops do not require a fast signal switching between launch and test response capture.

In an exemplary aspect of the present invention, a method for delay fault testing in an integrated circuit is provided. A subset of scan flip-flops from a scan chains may be selected to enhance TDF coverage. Next, the selected subset of scan flip-flops is converted with transition launch flops. Each of the transition launch (TL) flip-flop consists of an augmented flip-flop which includes additional multiplexer in front of a standard scan flop and a control input. The control input may be called a transition enable (TEN) signal. The TL flop may support various modes of operations including a functional mode, a standard broadside mode, an enhanced broadside mode, and a scan shift mode. Each mode of operations may be selected via a combination of TEN and SEN signals.

In another exemplary aspect of the present invention, the subset of scan flip-flops which are to be replaced with the TL flops may be selected from among the scan flip-flops through a topology based heuristic procedure. The topology based heuristic procedure may include a two-phase greedy procedure for pruning and ordering the subset of scan flip-flops.

In a further exemplary aspect of the present invention, the subset of scan flip-flops which have been replaced with the TL flops may be broken into two or more partitions in order to achieve maximum test coverage possible. Each partition of the converted subset of scan flip-flops may be controlled by a separate TEN signal. In this manner, the tester can activate an enhanced broadside mode selectively on a subset of flip-flops with their TEN signal activated while remaining flip-flops operated in the standard broadside mode. The TEN signals may be driven by newly inserted scan elements which can be part of scan chains.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic block diagram of a transition launch flip-flop in accordance with an exemplary embodiment of the present invention;

FIG. 2 illustates a table of scan flip-flop operation modes implemented by the transition launch flip-flop in FIG. 1;

FIG. 3 is a schematic block diagram of an exemplary circuit having transition launch flip-flops in accordance with an exemplary embodiment of the present invention;

FIGS. 4A-4D illustrate an example of a subset of scan flip-flops selection procedure in accordance with an exemplary embodiment of the present invention; and FIG. 5 is a flow diagram of a method implemented in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

Referring now to FIG. 1, a schematic block diagram of transition launch flip-flop 100 in accordance with the present invention is illustrated. It is well known to the art that skewed-load technique can make significant improvement in TDF coverage. However, skewed-load technique requires scan enable (SEN) signal to be timing closed for at-speed switching during test application. As mentioned above, the design effort involved in designing a fast SEN signal and the resulting impact on turnaround time is considered unacceptable for many designs. The transition launch flip-flop 100 does not require a fast signal switching between launch and test response capture.

In an embodiment of the present invention, a mutiplexer (MUX) may be added in front of a standard scan flip-flop to be converted to the transition launch flip-flop 100. The resulting augmented flip-flops 100 may be called a transition launch (TL) flip-flop which includes a multiplexer (MUX) 102 and a control input called transition enable (TEN) 104. The MUX 102 may be controlled by the control input (TEN) 104. The TL flip-flop may support various operation modes which are shown in FIG. 2. The various modes may include a functional mode, a standard broadside mode, an enhanced broadside mode, a scan shift mode, and the like. Each mode of operations may be selected via a combination of TEN and SEN signals.

For example, the TL flip-flop 100 may support two broadside test modes. In the first mode with SEN=TEN=0, all scan flip-flops in a scan chain operate as in the standard broadside test. In the second broadside test mode (i.e. enhanced broadside test mode) with SEN=0 and TEN=1, enhanced broadside test operations may be implemented during the launch and capture cycles.

In second broadside test mode, the TL flip-flop 100 (i.e. an enhanced scan flip-flops) operates in the following manner. In the launch cycle, the complement Q' 106 of the flip-flop content (the complement of the value scanned in during the initialization phase) is latched. This launches a transition on the output of the flip-flop, which drives the combinational logic of the circuit under test. During the capture cycle the content of the flip-flop is again complemented instead of capturing a test response. Thus, the TL flip-flop does not capture a test response during the capture cycle. This is done to avoid having to switch the TEN signal at-speed. Those of ordinary skill in the art will appreciate that the TL flip-flops may be driven by the same TEN signal for all launch transition during the launch cycle but none of the TL flip-flops capture the test response. The scan flip-flops which are not enhanced (not augmented with MUXs) may operate in the usual broadside test mode.

In a preferred embodiment of the present invention, in order to achieve the maximum test coverage possible when a given subset of scan flip-flops are replaced with TL flip-flops, the replaced subset of scan flip-flops may be partitioned into two or more partitions and connect an independent TEN signal to each partition. The partitioning may allow the testers to activate the enhanced broadside test mode only on a specific partition of the subset of transition launch flip-flops with their TEN signals activated while keeping the standard broadside test mode for the remaining flip-flops. It is to be noted that the improvement of the TDF coverage in the broadside testing may be achieved through various partitioning models.

The benefit of random partitioning model may be illustrated by an example as follows.

As illustrated in FIGS. 3A and 3B, FF1, FF2, FF4 and FF6 are standard scan flip-flops and FF3 and FF5 are TL flip-flops. The scan enable, scan path and clock connections are not shown for the sake of simplicity. It is assumed that the scan chain order is as indicated by the indices of the scan flip-flops and any desired next-state value can be obtained for FFI, FF2 and FF4 using normal functional operation. If standard broadside mode (with TEN=0) is used, the slow-to-rise fault at the output of NAND1 is not testable. The reason is that the fault initialization condition (FF3=FF4=1) implies that FF5 will be set to 1 during the launch cycle and therefore the fault propagation path is blocked at AND2. However, if enhanced broadside mode is used with TEN=1, then FF5 will be set to 0, which can be satisfied during the launch cycle by setting it to 1 during the initialization phase. Thus, the slow-to-rise fault at the output of NAND1 is testable.

In order to test the slow-to-fall fault at the output of AND1, the fault effect needs to be propagated through OR2 and captured by FF5. However, the initialization condition (FF1=FF2=1) forces FF3 to be set to 1 during the launch cycle, thus blocking the fault effect. If the enhanced broadside test mode is used (TEN=1), then FF3 is set to 0 during the launch cycle, which can be obtained by setting FF3=1 in the initialization phase. However, it is to be noted that FF5, which is also a TL flip-flop, cannot capture its D input when TEN=1. If FF3 and FF5 are controlled by independent TEN signals as shown in FIG. 3B then the fault can be testable by setting TEN1=1 and TEN2=0 during enhanced broadside mode.

It is to be noted that when two or more TEN signals are used, several different broadside test modes may be applied to scan chains at the same time. For example in the case of two TEN signals shown in FIG. 3B, it is possible to have four such test modes obtained by setting the TEN lines to four different possible combinations of values during the launch and capture cycles. When both TEN1=0 and TEN2=0, the normal broadside test mode will be implemented. The enhanced broadside test modes are obtained for other combinations of TEN signal values. The values of TEN signals for a given test are shifted in to a shift register as part of a test pattern.

Subset of Flip-flop Selection

In an embodiment, the desirable subset of scan flip-flops may be selected through various topology-based heuristic methods. Examples of a topology-based heuristic method include a static greedy algorithm, a dynamic greedy algorithm, or the like. It is contemplated that that there are various ways to select a subset of scan flip-flops without departing from the scope and spirit of the present invention. An exemplary greedy procedure to select the subset of scan flip-flops in accordance with an embodiment of the present invention may implement a two-phase greedy algorithm. The exemplary greedy procedure is described as follows.

Definition

1) FD is defined to denote a set of transition delay faults that can be detected with enhanced scan, which allows arbitrary two-pattern tests. 2) $FD_b$ is defined to denote a set of faults that are detected using standard broadside testing. FD_1 is defined to be FD_1=(FD−$FD_b$), representing another set of faults that should be targeted for detection by broadside testing through use of the enhanced scan flip-flops proposed in this invention. 3) $f_i$ is defined as a delay fault. A scan flip-flop $s_k$ is said to affect the fault $f_i$, if $s_k$ is in the input cone of the circuit line corresponding to $f_i$. 4) S_1 is defined as a set of scan flip-flops that are in the input cone of all faults in the set FD_1, i.e., S_1={s|s affects f for some f∈FD_1}. From S_1, a pruned and ordered list of flip-flops S_2⊆S_1 is obtained through a two-phase greedy procedure. 5) rank (s), which is the rank of a flip-flop s, is defined as the number of faults in FD_1 that s affects.

EXAMPLE PROCEDURE

An exemplary pseudo-code of the greedy procedure to select the subset of scan flip-flops in accordance with an embodiment of the present invention is as follows:
Procedure Select_Flip-Flops(S_1, FD_1)
Phase I:
STEP 1: Order the flip-flops in S_1 randomly. Set A=FD_1. Let $s_i$ denote the $i^{th}$ flip-flop in the ordered set S_1. Let N be the number of flip-flops in S_1.
STEP 2: DO for i=1 to N:
  IF $s_i$ affects some fault f∈A, delete from an every fault f such that $s_i$ affects f.
  ELSE delete $s_i$ from S_1.
/* At the end of Phase I, the size of S_1 is reduced */
Phase II:
STEP 1: For every s∈S_1, compute rank (s). Let M be the number of flip-flops in S_1.
Set S_2=∅
STEP 2: WHILE S_1 ≠ ∅, DO
  Pick the flip-flop $s_{max}$ with the highest rank in S_1 (in case of a tie pick one randomly)
  Add $s_{max}$ to S_2
For every f∈FD_1, if $s_{max}$ affects f then delete f from FD_1.
Delete $s_{max}$ from S_1 Compute the ranks of the flip-flops in S_1 using the reduced set FD_1.
For example, FD_1 may include {f1, f2, f3, f4, f5, f6, f7, f8, f9, f10, f11} and S_1 may include {s1, s2, s3, s4, s5, s6, s7} which may be the subset of scan flip-flops that affect the faults in FD_1. As shown in FIG. 4A, the faults from FD_1 that are affected by each flip-flop in S_1. Then, the flip-flops in S_1 are ordered in increasing order of their numerical indices. During Phase I of the proposed procedure, beginning with s1, each flip-flop is checked if it affects a fault in FD_1 that is not already affected by previous flip-flops. It may be the case that the faults affected by s4, for example f1, f4, f8, are affected by flip-flops s1 and s3. Flip-flops s1 and s3 have been considered previously. Consequently, s4 is dropped from the set S_1. Similarly, s7 is also dropped because the fault f10 is affected by s5. Thus, S_1 may result in including {s1, s2, s3, s5, s6} at the end of Phase I.

FIG. 4B shows the affected faults and the rank of each flip-flop at the start of Phase II. In the first iteration, s3 is selected, removed from S_1 and added to S_2. The faults {f1, f2, f5, f7, f8, f9} are removed from the set FD_1. The ranks of the remaining flip-flops in S_1 is computed based on the new DF'={f3, f4, f6, f10, f11} as shown in FIG. 4C. s6 is selected in the next iteration and added to the set S_2. The new FD_1={f4, f10} and S_1={s1, s2, s5} are obtained by removing the faults affected by s6 from FD_1 as well as removing s6 from S_1. Since s2 does not affect any faults in the FD_1, it is removed from S_1. The new ranks of the remaining flip-flops s1 and s5 are shown in FIG. 4D Since both have the same rank, one of them is selected. The remaining flip-flop is selected in the last iteration, resulting in S_2={s3, s6, s1, s5}.

FIG. 5 is a flow diagram of a method 500 implemented in accordance with an exemplary embodiment of the present invention. The method 500 may include steps as follows. A scan chain of a circuit may include scan flip-flops which are configured to be utilized in a transition delay fault testing. A subset of scan flip-flops to be replaced with transition launch flip-flops may be selected in order to improve TDF coverage in Step 502. The desirable subset of scan flip-flops may be selected through a topology based heuristic procedure. Then, the selected subset of scan flip-flops may be replaced with TL flops in Step 504. In Step 506, the replaced subset of scan flip-flops may be broken into several partitions. Each partition may be configured to be controlled by a separate control input in Step 508. Accordingly, the scan chain includes standard scan flip-flops and TL flops, which is suitable for being utilized in the enhanced broadside testing.

The present invention may provide various advantages over conventional delay fault test schemes. The skewed-load testing approach as well as enhanced scan methods may provide higher delay test coverage than the broadside testing approach. However, the broadside testing does not require fast signals, which is desirable for many designs. The method of the present invention implements an enhanced broadside testing which results in improved TDF coverage. Since the present invention implements clocking similar to the broadside testing, it does not require control signals to operate at-speed during test. Advantageously, the present invention requires an area overhead of only one additional MUX per selected scan flip-flop. Since the numbers of converted scan flip-flops are limited and only one additional MUX per selected scan flip-flop contributes the area overhead, the overall chip area overhead may be minimal. Further, the present invention does not increase the length of scan chains.

In the exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the improved delay fault test of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for enhanced broadside testing in an integrated circuit, comprising:
   configuring at least one scan flip-flop in a scan chain to operate as a transition launch flip-flop,
   wherein the at least one scan flip-flop comprises a scan multiplexer having a scan enable signal,
   wherein the at least one scan flip-flop is an augmented scan flip-flop including a transition multiplexer having a transition enable signal,
   wherein the step of configuring the at least one scan flip-flop as a transition launch flip-flop comprises setting the transition enable signal of the transition multiplexer of the at least one augmented scan flip-flop.

2. The method of claim 1, further comprising the step:
   separating a plurality of transition launch flip-flops into a plurality of partitions.

3. The method of claim 1,
   wherein the step of separating the plurality of transition launch flip-flops into a plurality of partitions comprises routing two or more independent transition enable signals to two or more transition multiplexers.

4. The method of claim 1,
   wherein a fast switching scan enable signal is not necessary for functional mode operations and broadside test mode operations for each of the plurality of transition launch flops.

5. The method of claim 4,
   wherein the broadside test mode operations include standard broadside test mode operations and enhanced broadside test mode operations.

6. The method of claim 5,
   wherein the enhanced broadside mode operations are selectively activated on the transition launch flip-flops while the standard broadside mode operations are activated on remaining scan flip-flops in the scan chain.

7. The method of claim 1,
   where the step of configuring the at least one scan flip-flop further comprises:
      selecting desirable scan flip-flops to be configured as transition launch scan flip-flops through a topology based heuristic algorithm.

8. The method of claim 7,
   wherein the topology based heuristic algorithm is a two-phase greedy algorithm.

9. The method as described in claim 1,
   wherein each of the at least one transition launch flip-flops use a same clock for scan operation and functional operation.

10. A system for improving delay fault coverage in a delay fault test of integrated circuits, comprising:
    means for configuring at least one scan flip-flop in a scan chain to operate as a transition launch flip-flop,
    wherein the at least one scan flip-flop comprises a scan multiplexer having a scan enable signal,
    wherein the at least one transition launch flip-flop is an augmented scan flip-flop including a multiplexer and a transition enable signal,
    wherein the at least one the transition launch flip-flop is configured through the transition enable signal.

11. The system as described in claim 10, further comprising:
    means for separating the transition launch flip-flops into a plurality of partitions;
    means for controlling each of the plurality of partitions by separate transition enable signals.

12. The system as described in claim 11,
    wherein the separate transition enable signals are driven by additional scan elements suitable for being a part of a scan chain.

13. The system as described in claim 10,
    wherein the scan enable signal does not need to be at-speed for functional mode operations and broadside test mode operations for each of the plurality of transition launch flops.

14. The system as described in claim 13,
    wherein the broadside test mode operations include standard broadside test mode operations and enhanced broadside test mode operations.

15. The system as described in claim 10,
    the means for configuring at least one scan flip-flop further comprising:
       means for selecting desirable scan flip-flops to be configured as transition launch scan flip-flops through a topology based heuristic algorithm.

16. The method of claim 15,
    wherein the topology based heuristic algorithm is a two-phase greedy algorithm.

17. The method as described in claim 10,
    wherein each of the at least one transition launch flip-flops use a same clock for scan operation and functional operation.

18. A method for improving a delay fault coverage in broadside testing, comprising:
    selecting at least one scan flip-flop from a plurality of scan flip-flops to be configured as a transition launch flip-flop through a topology based heuristic procedure; and
    configuring the at least one scan flip-flop as a transition launch flop;
    wherein the at least one transition launch flip-flop is an augmented scan flip-flop including a multiplexer having a transition enable signal
    wherein the at least one augmented scan flip-flop is configured to support a plurality of modes of operation.

19. The method as described in claim 18, further comprising:
    separating the transition launch flip-flops into a plurality of partitions having separate transition enable signals;
    controlling each of the plurality of partitions by a separate transition enable signal.

20. The method as described in claim 19,
    wherein the separate transition enable signal is driven by an additional scan element suitable for being a part of the scan chain.

21. The method as described in claim 18,
wherein the plurality of modes of operation of the transition launch flip-flops includes a functional mode, a standard broadside test mode, an enhanced broadside test mode, and a scan shift mode.

22. The method as described in claim 18,
wherein the flip-flop modes of operation are selected through a combination of scan enable and transition enable signals.

\* \* \* \* \*